(12) United States Patent
Mattisson et al.

(10) Patent No.: US 6,724,247 B2
(45) Date of Patent: Apr. 20, 2004

(54) FM DEMODULATOR HAVING DC OFFSET COMPENSATION

(75) Inventors: Sven Mattisson, Bjärred (SE); Jacobus C. Haartsen, Hardenberg (NL)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/234,180

(22) Filed: Sep. 5, 2002

(65) Prior Publication Data

US 2003/0090317 A1 May 15, 2003

Related U.S. Application Data

(60) Provisional application No. 60/322,440, filed on Sep. 17, 2001.

(30) Foreign Application Priority Data

Sep. 13, 2001 (GB) .............................................. 0122179

(51) Int. Cl.$^7$ ............................. H03D 3/00; H04L 25/06
(52) U.S. Cl. ........................ 329/318; 329/315; 375/317; 375/319
(58) Field of Search ................................ 329/300–303, 329/315, 318–321; 375/317, 319, 324, 334–337; 455/205, 214, 337

(56) References Cited

U.S. PATENT DOCUMENTS

| 4,029,904 A | * | 6/1977 | Papeschi ..................... 375/318 |
| 4,246,541 A | | 1/1981 | Ishigaki |
| 4,309,763 A | * | 1/1982 | Passmore et al. .............. 367/3 |
| 4,873,702 A | | 10/1989 | Chiu |
| 4,878,029 A | | 10/1989 | Saulnier et al. |
| 5,249,204 A | | 9/1993 | Funderburk et al. |
| 5,705,949 A | | 1/1998 | Alelyunas et al. |

FOREIGN PATENT DOCUMENTS

| DE | 3903394 | 8/1990 |
| EP | 0430480 | 6/1991 |
| FR | 2601533 | 1/1988 |
| GB | 1123054 | 8/1968 |
| GB | 1275248 | 5/1972 |
| GB | 1321948 | 7/1973 |
| GB | 2283871 | 5/1995 |
| GB | 2335809 A | 9/1999 |
| WO | WO90/14727 | 11/1990 |
| WO | WO96/20540 | 7/1996 |

* cited by examiner

Primary Examiner—David Mis
(74) Attorney, Agent, or Firm—Burns, Doane, Swecker & Mathis, LLP

(57) ABSTRACT

An FM demodulator compensates for DC offset by detecting the positive peak value of the frequency demodulated signal (D1, C2, R1) and the negative peak value of the frequency demodulated signal (D2, C3, R2). The mean of the positive and negative peak values is determined (C1, R3, R4) to produce an estimation of a DC offset value. This estimated DC offset value is then used to compensate for DC offset in the frequency demodulated signal. This circuit has the advantage of enabling the DC offset to be calculated without requiring complex digital signalling processing, and without requiring the input signal to have a zero mean. A signal strength signal RSSI may be used to disconnect the DC offset compensation circuitry during periods when the input signal strength is weak.

8 Claims, 4 Drawing Sheets

FM DEMODULATOR HAVING DC OFFSET COMPENSATION

This application claims priority under 35 U.S.C. §§119 and/or 365 to 0122179.5 filed in Great Britain on Sep, 13, 2001, the entire content of which is hereby incorporated by reference; and claims priority under 35 U.S.C. §119 to U.S. Provisional Application No. 60/322,440 entitled FM DEMODULATOR HAVING DC OFFSET COMPENSATION and filed on Sep. 17, 2001, the entire content of which is hereby incorporated by reference.

TECHNICAL FIELD

The invention relates to an FM demodulator having DC offset compensation. In particular, the invention is suited for use in an FM radio system of the kind in which the intermediate frequency (IF) strip of the digital FM radio circuit is tuned to the nominal IF (eg. pretuned or automatically tuned) and in which the signal properties are such that the portion used for detection (eg. the preamble) contains one of each possible symbol in N symbols (ie. at most N−1 consecutive ones or zeros in the 2-level GFSK modulation case).

BACKGROUND

FIG. 1 shows a conventional FM demodulator. The demodulated signal is obtained by firstly multiplying the incoming signal $V_{IF}$ by its time derivative, obtained from a differentiation circuit 3, in a multiplier 2. This operation makes the product amplitude proportional to the signal amplitude as well as the signal's angular frequency (intermediate frequency plus FM frequency deviation). If the FM signal is held to a constant amplitude by means of automatic gain control (AGC) or use of a hard limiter, the product signal will have an amplitude proportional to the frequency deviation. Thus, the modulation signal can be easily recovered by feeding the multiplier output to a low-pass filter 1, to remove signal components at multiples of the IF frequency.

FM demodulators of this kind require accurate delay elements and filters with accurately controlled phase characteristics to generate the time-derivative approximation. Otherwise, excessive DC offsets will occur. Another source of DC offset is reference oscillator (LO) inaccuracies which result in the IF frequency being offset from its nominal value (hence corresponding to a DC level in the modulated FM signal).

Known IF filters and FM detectors in use today often employ passive resonator components that are trimmed, either at production or by exploiting signal properties. When the resonators are pre-tuned, they are tuned to the nominal IF frequency. FM detectors often exploit signal properties (e.g. notional zero mean of the detected signal) to automatically compensate for detuning. This detuning may be due to resonators deviating from their nominal values, or the received IF signal being offset in frequency due to a combination of frequency offsets in the local and remote reference oscillators.

Adjusting an IF strip (IF filter and FM detector) to the nominal IF frequency does not guarantee a DC free baseband signal, even if the baseband signal nominally has a zero mean. Skewing the detector of a properly tuned IF strip to minimize its DC offset will compensate for local and remote reference frequency differences and will improve sensitivity. Such FM detector offset compensation schemes rely on the signal having a theoretical zero mean (analog systems) or a known part of the signal (i.e. the preamble of a digital FM signal) having a theoretical zero mean. If the signal, or its preamble, is not so structured as to have zero mean, offset compensation is difficult and requires complex digital signalling processing (DSP) rather than simpler analog circuitry.

The present invention seeks to overcome these disadvantages by having a DC offset compensation circuit that does not rely on a signal having zero mean, or rely on a signal preamble having a zero mean, and which does not require complex digital signalling processing (DSP).

SUMMARY OF THE INVENTION

According to a first aspect of the invention, there is provided a frequency modulated signal demodulator including DC offset compensation, wherein the DC offset compensation circuit comprises means for deriving the positive and negative peak values of a frequency demodulated signal, means for determining the mean of the positive and negative peak values as an estimate of a DC offset value, and means for utilising this estimated DC offset value to compensate for DC offset in the frequency demodulated signal.

In a first preferred embodiment, a DC offset compensation circuit for use in an FM demodulator according to the invention comprises an input for receiving the frequency demodulated baseband signal; an output for an estimated DC offset signal; a pair of diodes connected in parallel with opposite polarity, between the input and output; a resistor connected in parallel with the pair of diodes; and, an output capacitor connected between the output and a ground terminal.

According to a second preferred embodiment, a DC offset compensation circuit for use in an FM demodulator according to the invention comprises an input for receiving a frequency demodulated signal; an output for an estimated DC offset signal; a first diode having its cathode connected to the input and its anode connected to a ground terminal via a first capacitor, wherein the anode is also connected to a negative supply terminal via a first resistor and to the output via a second resistor; a second diode having its anode connected to the input and its cathode connected to a ground terminal via a second capacitor, wherein the cathode is also connected to a positive supply terminal via a third resistor and to the output via a fourth resistor; and, a third capacitor connected between the output and a ground terminal.

Preferably, signal strength signal operated means is used to switch the peak signal offset compensation ON and OFF. This has the advantage of allowing the tracking to be switched ON when the signal strength is high and switched OFF when signals are weak, leading to faster settling time of the offset compensation circuit.

Preferably, the output of the envelope detector is passed to a filter for suppressing noise and other high-frequency components.

Preferably, the filter is a non-linear offset estimator. This has the advantage of speeding up the response at the turn on transient.

BRIEF DESCRIPTION OF THE DRAWINGS

For a better understanding of the present invention reference will now be made, by way of example, to the accompanying drawings, in which.

DETAILED DESCRIPTION OF A PREFERRED EMBODIMENT OF THE INVENTION

Figure 1:
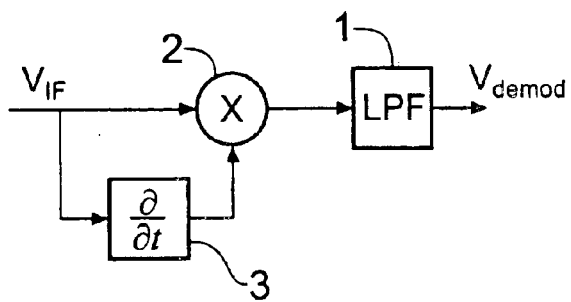
FIG. 1 shows a standard FM demodulator.
Figure 2:
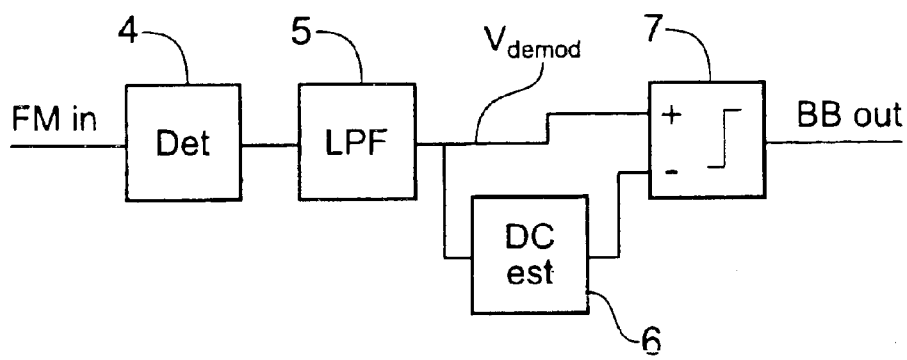
FIG. 2 shows a block diagram of an FM demodulator according to the present invention.

FIG. 2 shows an FM demodulator employing DC offset compensation according to the present invention. The incoming FM signal passes through a detector 4 (comprising, for example, a multiplier 2 and time derivative circuit 3 as shown in FIG. 1). The output signal of detector 4 is then passed through a filter, for example a low pass filter 5, to obtain a demodulated signal $V_{demod}$ which may have a DC offset. Any DC offset contained in this signal is estimated using a DC offset compensation circuit 6, the output of which is used in a correction circuit 7 to adjust the demodulated signal $V_{demod}$ to correct for the estimated DC offset in the output of detector 4.

Advantageously, the correction circuit 7 is a difference amplifier, the output of which is the amplified difference between the actual signal and the estimated DC offset. Preferably, the output of the difference amplifier is saturated so that it provides a digital (i.e. high or low) output signal.

The DC offset is estimated by deriving the positive and negative peak signal envelope values (i.e. utilising a maximum and minimum value detector circuit) and taking the mean value of these two peaks to be the DC offset. By having fast attack and slow decay in the peak detectors, the average value may be computed using only a few symbols and will also compensate for inter-symbol interference.

Figure 3:
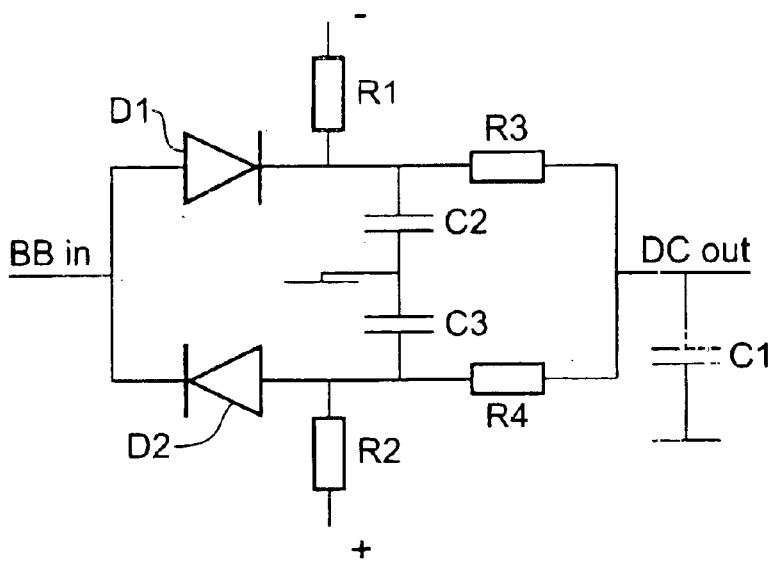
FIG. 3 shows one embodiment of a DC offset compensation circuit for use in an FM demodulator according to the present invention.

FIG. 3 shows one preferred embodiment of a DC offset compensation circuit for use in a detector according to the invention. The circuit comprises envelope peak detectors implemented by means of regular diode detectors D1 and D2 having capacitors C2, C3 connected to the diodes to store the peak values. The stored values decay to either supply via resistors R1 and R2. The mean of the peak values stored on capacitors C2, C3 is integrated and stored on capacitor C1, connected to the output.

In order to speed up the response at the turn on transient, the filter following the envelope detector is nonlinear, which means that it operates quicker on large errors and slower on small errors.

Figure 4:
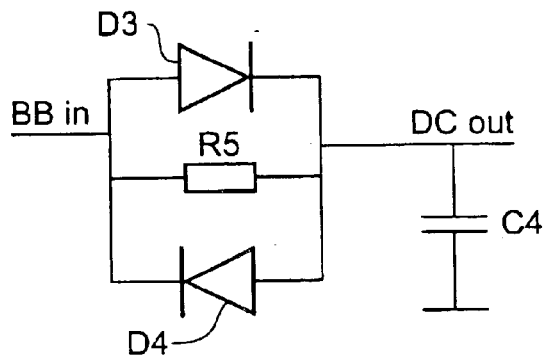
FIG. 4 shows a second embodiment of a simplified DC offset compensation circuit for use in an FM demodulator according to the present invention.

The circuit of FIG. 3 may be simplified as shown in FIG. 4 if the forward drop of the diodes used in the DC estimator is slightly higher than the detected FM-signal.

Preferably, if a Received Signal Strength Indicator (RSSI) signal is available, this may be used to switch the envelope-tracking offset compensation ON and OFF. With such an arrangement, the tracking may be switched ON when signal strength is high and OFF when signals are weak, and in this way the settling time of the offset compensation will be reduced.

Figure 5:
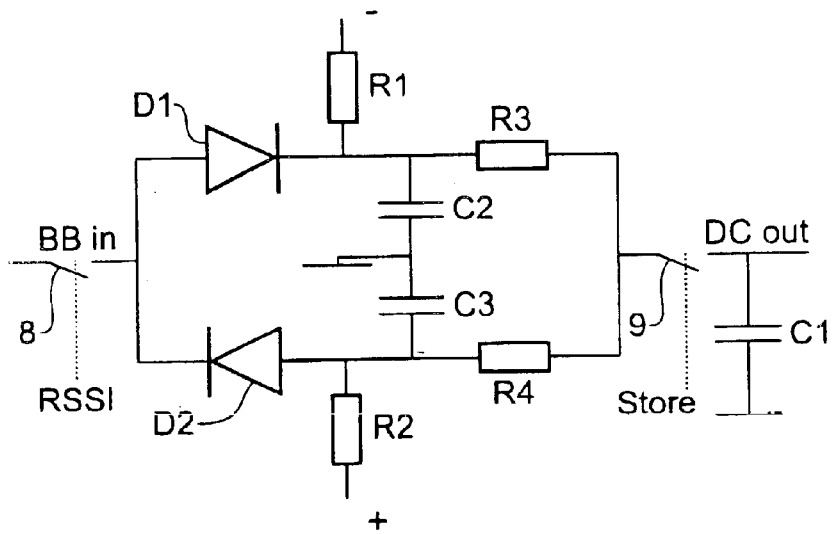
FIG. 5 shows a third embodiment of a DC offset compensation circuit for use in an FM demodulator according to the present invention.

FIG. 5 shows how the signal strength switching may be employed in one of the embodiments. This circuit corresponds to the circuit of FIG. 3 with switch 8 inserted in series with the input to disconnect the detector circuit from the input under weak-signal conditions.

Additionally, in the detector circuit of FIG. 5, the output capacitor C1 can be separated from the rest of the circuit by means of a switch 9, to freeze the offset to the value obtained at a certain position in the input signal. This allows the offset compensation to be held and the last value remembered for the duration of the pulse. This will improve sensitivity when the input signal contains long sequences with one symbol only, which otherwise could result in a degrading effect on the DC offset estimate.

It is noted that, although switches 8 and 9 are shown as separate switches, they could also be realised as two sections of the same switch. Thus, the switches may be operated together or independently.

Figure 6:
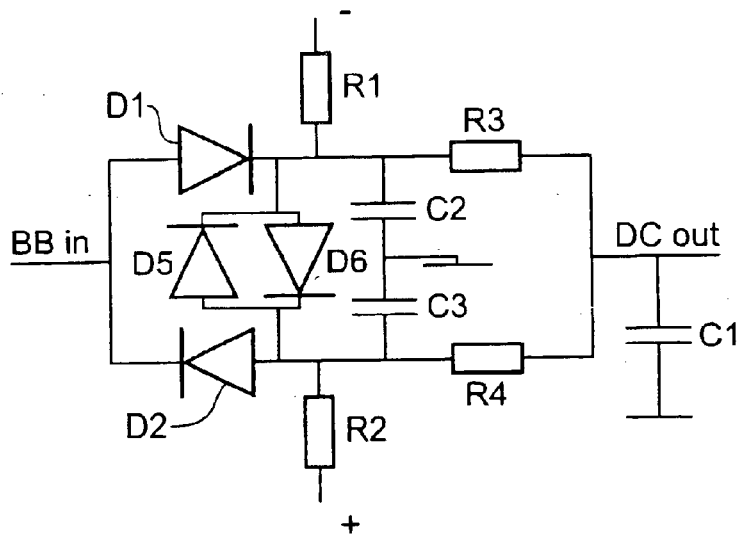
FIG. 6 shows a fourth embodiment of a DC offset compensation circuit for use in an FM demodulator according to the present invention.
Figure 7A:
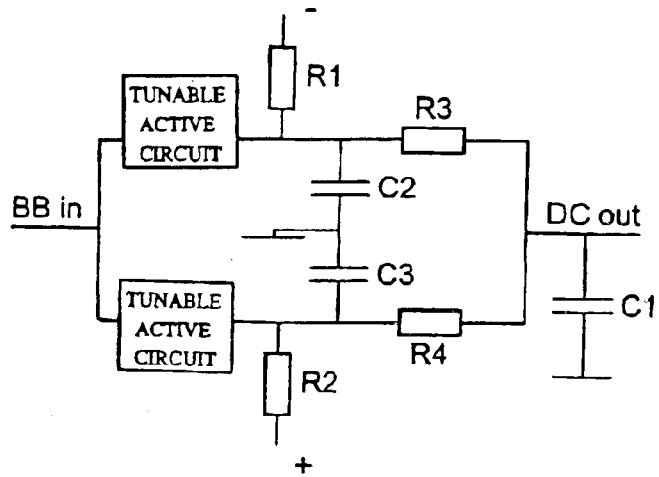
FIGS. 7A–7D show a DC offset compensation circuit with tunable active circuits corresponding to the DC offset compensation circuits illusrated in FIGS. 3–6.
Figure 7B:
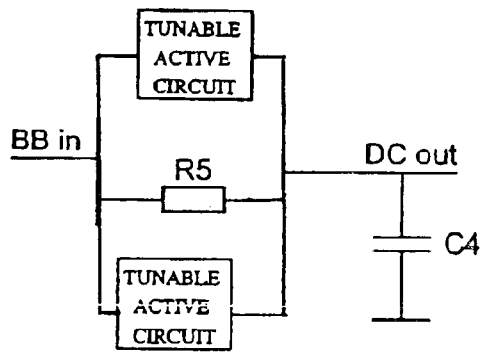
Figure 7C:
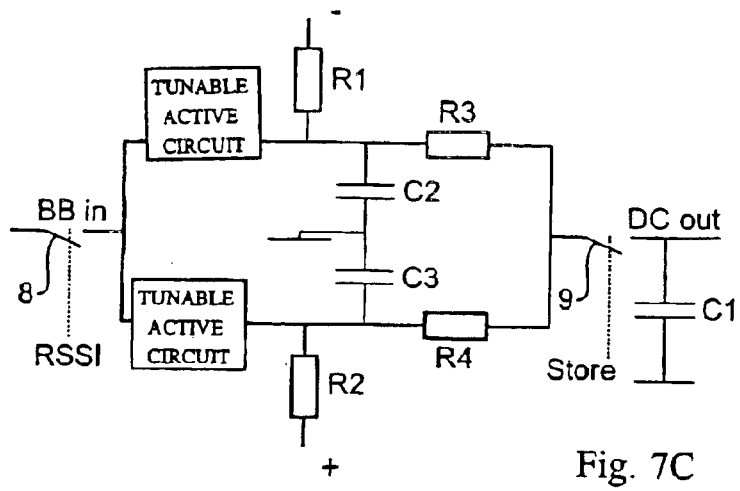
Figure 7D:
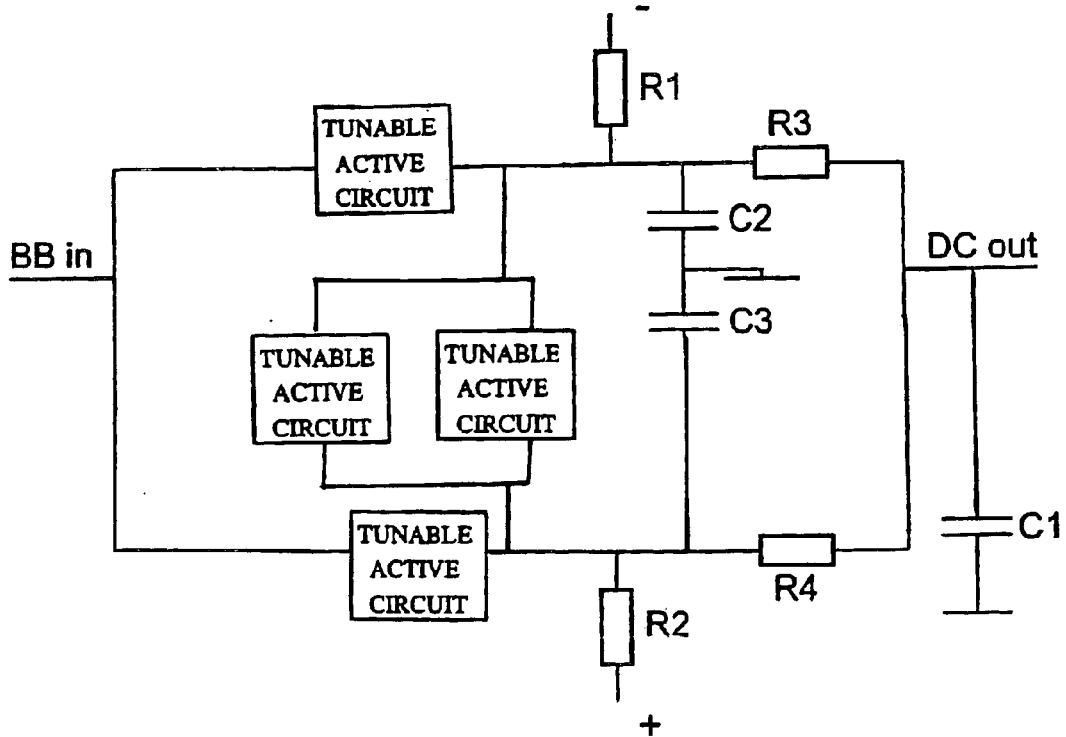

The response time of FIG. 3 at the turn on transient may be reduced using the circuit shown in FIG. 6. This circuit exploits the knowledge that the difference in signal peak values is known and finite ($V_{max}-V_{min}<V_{mod}$+noise). The cross coupled diodes D5, D6 in FIG. 6 charge the peak storage capacitors close to their known values.

In other words, if it is assumed that the detected signal is described as:

V_DC+V_s*cos(w(t)*t)+N (where N is random noise)

then, the DC level will be between

V_DC+V_s+N and V_DC−V_s+N

Given that a positive peak is V_DC+V_s+N, it can be estimated that the negative peak will be at the positive peak less 2*V_s. The diodes D5 and D6 in FIG. 6 carry out this estimation.

The value of V_s will vary depending on the transmitter and the noise N will be unpredictable. Diodes D5 and D6 will therefore pull the estimated peak within range, thereby enabling better detection of data even when no opposing peak has yet been received. Eventually, D1+R1 and D2+R2 will pull the peaks closer to their actual values, as described above.

For example, a positive peak will charge the capacitor storing the minimum value to the positive peak less a diode drop which is close to the expected negative peak of the received signal. Thus, the attack of the estimator is fast so that as soon as any symbol is received it theoretically reaches the stored value. Because of inter-symbol interference the maximum peak values will be reached after a few symbols, depending on the filter characteristics on both the TX and RX side.

In other words, when a signal is filtered some delay is added to the impulse response resulting in a longer rise time. A DC estimator detects the peak and when the signal is "smeared" because of high inter-symbol interference it may take a few symbols before the maximum peak is reached. Thus, a 1010 pattern will never reach the maximum peak since the first 1 has not settled when the first 0 arrives, and so on. This is synonymous to a heavily low-pass filtered square wave, i.e. its peak amplitude will be lower when the filter suppresses high frequency components. When the pattern is 111000, for example, this corresponds to a lower frequency wave and the filtering effect is much less, resulting in a more accurate peak estimation.

Although the present invention does not rely on there being a synchronisation signal (eg. a preamble having zero mean), if such a signal is present, then the DC offset estimator may be preset, or reset, prior to receipt of the preamble, so as to speed up the initial transient.

The described invention offers an FM demodulator having a DC offset compensation circuit that is compatible with integration and automatic tuning. Such offset compensation can be used to reduce or minimise the effects of reference oscillator drifts without requiring a dedicated signal preamble. Non-linear offset estimators may also be used to speed up the response at the turn on transient.

It is noted that any of the diodes mentioned in the circuits above may be replaced by an active circuit that simulates a diode as illustrated in FIGS. 7A–7D. This enables the voltage drop to be turned to any desired value.

Although optimal performance of the invention is obtained with a dedicated DC-free sequence (i.e. because the DC estimator can be tuned without having to detect any data), it is noted that the nonlinear estimator makes it possible to achieve an acceptable DC estimate having received only a few alternating symbols (i.e. using a very short dedicated sequence or no dedicated sequence at all).

Furthermore, although the preferred embodiment does not attempt to drive the DC component of the detector output to zero, it is noted that, alternatively, the DC signal in the output of the detector could be driven low in this way. For example, the estimated DC signal could be input to a regulator that tunes the delay in the delay circuit to shift the centre frequency of the FM detector (or simply re-tune the FM detector), such that the output signal contains zero DC component.

What is claimed is:

1. A frequency modulated signal demodulator including a DC offset compensation circuit, wherein the DC offset compensation circuit comprises:
   means for deriving the positive and negative peak values of a frequency demodulated signal;
   means for determining the mean of the positive and negative peak values as an estimate of a DC offset value; and,
   means for utilising this estimated DC offset value to compensate for DC offset in the frequency demodulated signal:
      an input for receiving the frequency demodulated signal;
      an output for an estimated DC offset signal;
      a pair of diodes connected in parallel with opposite polarity, between the input and output;
      a resistor connected in parallel with the pair of diodes; and
      an output capacitor connected between the output and a ground terminal.

2. A demodulator as claimed in claim 1, wherein at least one diode is replaced by an active circuit which simulates the function of a diode.

3. A demodulator as claimed in claim 2, wherein the voltage drop of the active circuit is turnable.

4. A frequency modulated signal demodulator including a DC offset compensation circuit, wherein the DC offset compensation circuit comprising;
   means for deriving the positive and negative peak values of a frequency demodulated signal;
   means for determining the mean of the positive and negative peak values as an estimate of a DC offset value; and,
   means for utilising this estimated DC offset value to compensate for DC offset in the frequency demodulated signal;
      an input for receiving a frequency demodulated signal;
      an output for an estimated DC offset signal;
      a first diode having its cathode connected to the input and its anode connected to a ground terminal via a first capacitor, wherein the anode is also connected to a negative supply terminal via a first resistor and to the output via a second resistor;
      a second diode having its anode connected to the input and its cathode connected to a ground terminal via a second capacitor, wherein the cathode is also connected to a positive supply terminal via a third resistor and to the output via a fourth resistor; and
      an output capacitor connected between the output and a ground terminal.

5. A demodulator as claimed in claim 4, wherein the DC offset compensation circuit further comprises:
   a pair of diodes connected in parallel with opposite polarity, between the anode and cathode of the first and second diodes respectively.

6. A frequency modulated signal demodulator including a DC offset compensation circuit, wherein the DC offset compensation circuit comprises:
   means for deriving the positive and negative peak values of a frequency demodulated signal;
   means for determining the mean of the positive and negative peak values as an estimate of a DC offset value; and,
   means for utilising this estimated DC offset value to compensate for DC offset in the frequency demodulated;
   signal strength switching means for disconnecting the frequency demodulated signal from the input of the DC offset compensation circuit during weak-signal conditions.

7. A frequency modulated signal demodulator including a DC offset compensation circuit, wherein the DC offset compensation circuit comprises;
   means for deriving the positive and negative peak values of a frequency demodulated signal;
   means for determining the mean of the positive and negative peak values as an estimate of a DC offset value; and,
   means for utilising this estimated DC offset value to compensate for DC offset in the frequency demodulated;
   signal strength switching means for disconnecting an output capacitor from the DC offset compensation circuit during weak-signal conditions.

8. A frequency modulated signal demodulator including a DC offset compensation circuit, wherein the DC offset compensation circuit comprises:
   means for deriving the positive and negative peak values of a frequency demodulated signal;
   means for determining the mean of the positive and negative peak values as an estimate of a DC offset value; and,
   means for utilising this estimated DC offset value to compensate for DC offset in the frequency demodulated signal;
   comprising signal strength switching means for disconnecting the frequency demodulated signal from the input to the DC offset compensation circuit and for disconnecting an output capacitor from the DC offset compensation circuit during weak-signal conditions.

* * * * *